United States Patent
Emoto et al.

[11] Patent Number: 5,988,394
[45] Date of Patent: Nov. 23, 1999

[54] TRAY FOR CONTAINING PARTS FOR STORAGE AND TRANSPORTATION

[75] Inventors: Takao Emoto, Yokosuka; Hisayoshi Kunii, Sagamihara, both of Japan

[73] Assignee: Kabushiki Kaisha Toshiba, Kawasaki, Japan

[21] Appl. No.: 08/979,934

[22] Filed: Nov. 26, 1997

[30] Foreign Application Priority Data

Nov. 28, 1996 [JP] Japan ................................ 8-318000

[51] Int. Cl.⁶ .............................................. B65D 85/90
[52] U.S. Cl. ........................ 206/724; 206/562; 206/564; 220/23.4
[58] Field of Search ............................ 206/713–717, 206/724, 725, 701, 562, 564; 220/23.4

[56] References Cited

U.S. PATENT DOCUMENTS

| | | | |
|---|---|---|---|
| 2,732,969 | 1/1956 | Browne | 220/23.4 |
| 3,131,829 | 5/1964 | Masser | 220/23.4 |
| 3,701,079 | 10/1972 | Bowden et al. | 206/724 |
| 5,103,976 | 4/1992 | Murphy | 206/725 |
| 5,310,076 | 5/1994 | Burton et al. | 206/725 |
| 5,333,733 | 8/1994 | Murata | 206/714 |
| 5,503,895 | 4/1996 | Ziberna | 206/717 |
| 5,547,082 | 8/1996 | Royer et al. | 206/725 |
| 5,767,433 | 6/1998 | Bill et al. | 220/23.4 |
| 5,772,038 | 6/1998 | Murata et al. | 206/725 |

*Primary Examiner*—Jim Foster
*Attorney, Agent, or Firm*—Foley & Lardner

[57] ABSTRACT

A tray (1) has an upper surface (3) an upper surface provided with a plurality or pockets (10) for containing parts (50) in a regular, longitudinal arrangement at a predetermined pitch in a single row. The tray (1) has a pair of longitudinal first side surfaces (6A, 6B), and teeth (30) are arranged at equal intervals on the first side surfaces (6A, 6B). Pins (35) driven by a linear driving mechanism are fitted in grooves (38) between the adjacent teeth (30) to feed the tray (1) accurately in the longitudinal direction. A tray assembly of a desired capacity can be formed by combining a necessary number of the trays (1) in a transverse arrangement by engaging the teeth (30) of the tray (1) with the grooves (38) of the adjacent tray (1).

14 Claims, 11 Drawing Sheets

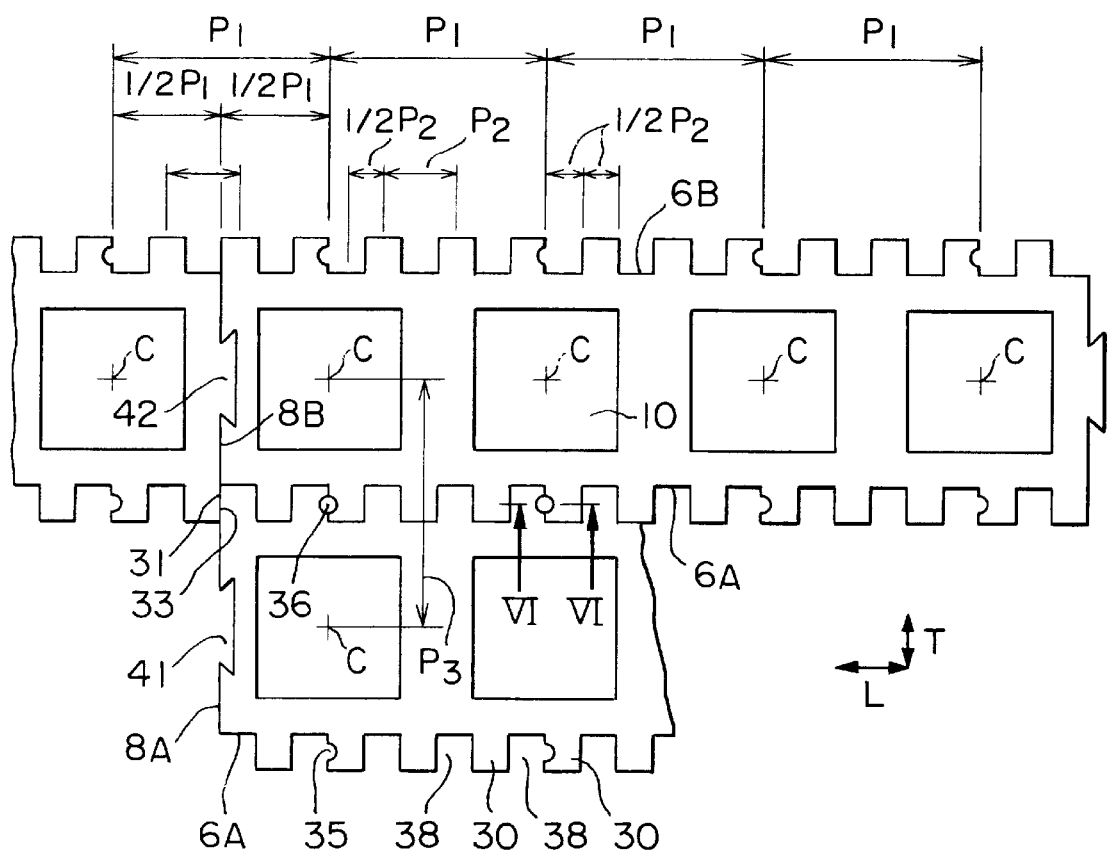
F I G. 4

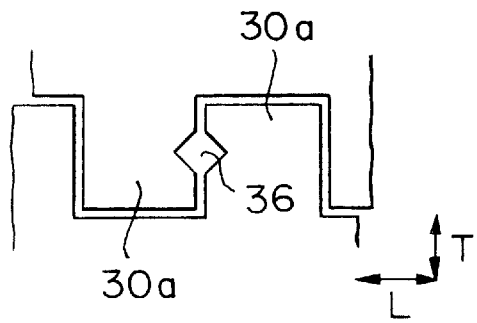
F I G. 7A
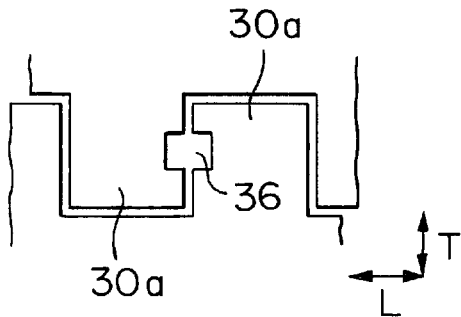
F I G. 7B
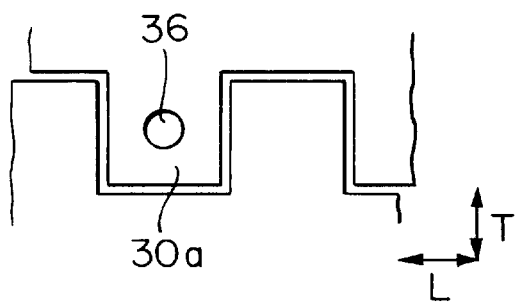
F I G. 8
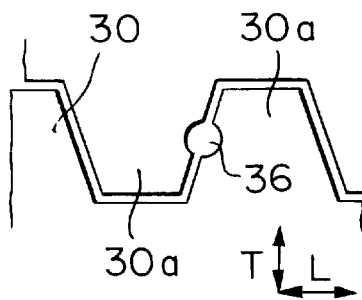
F I G. 9A
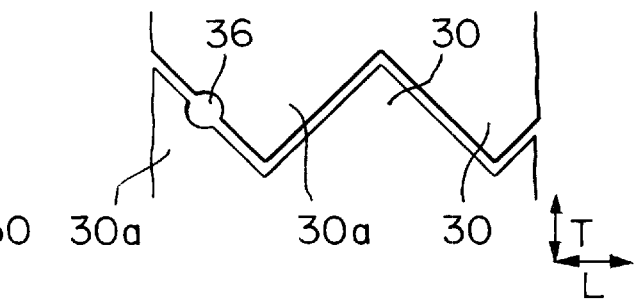
F I G. 9B

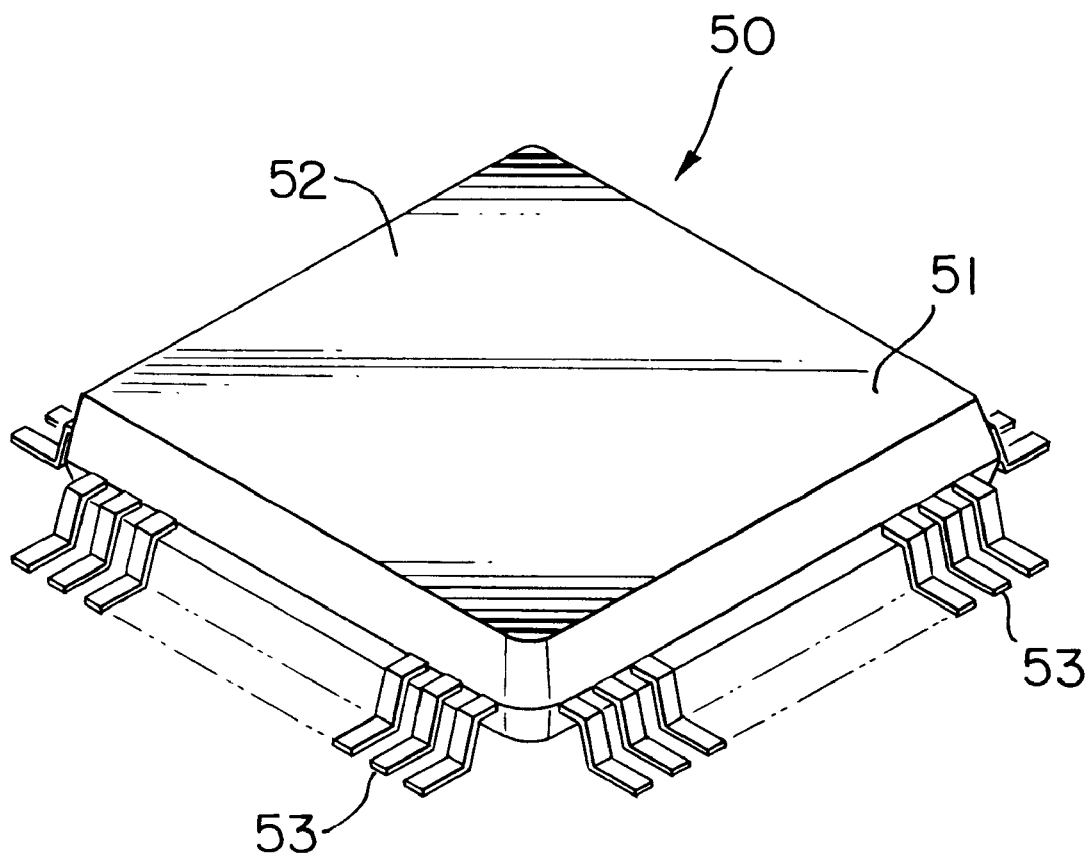
F I G. 11

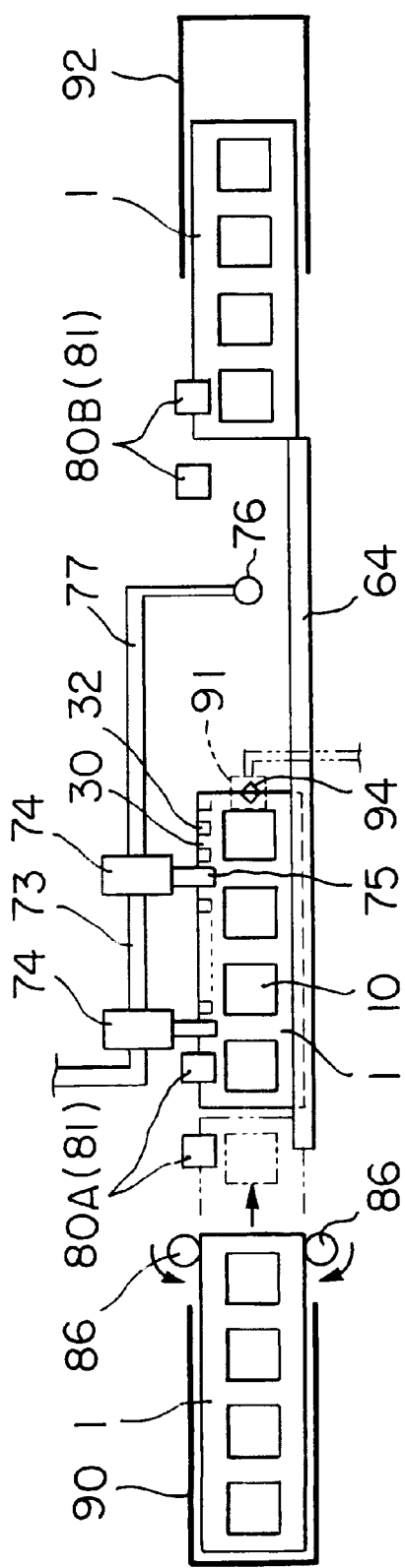
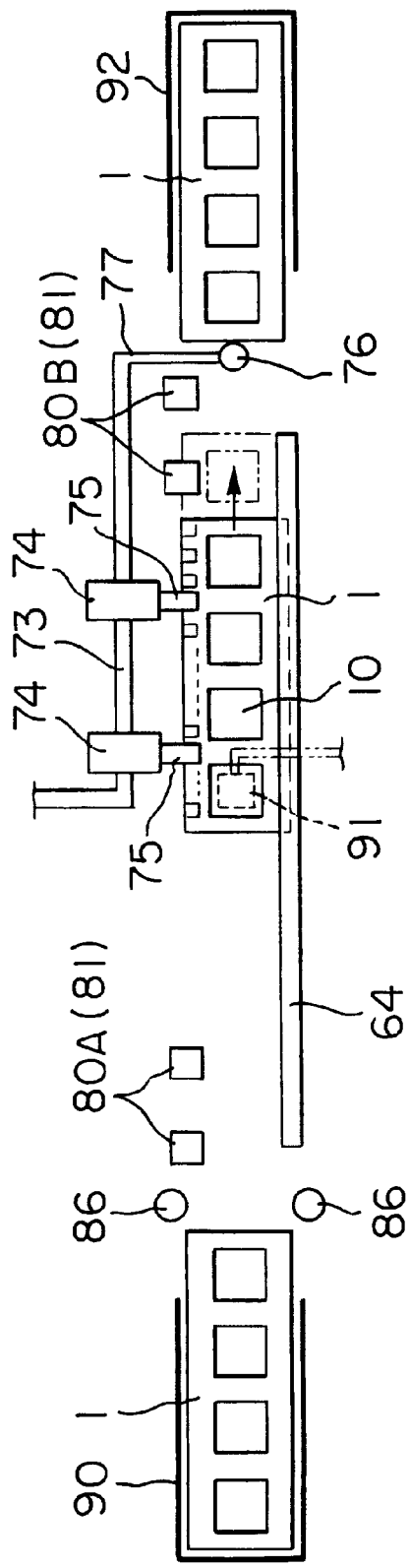

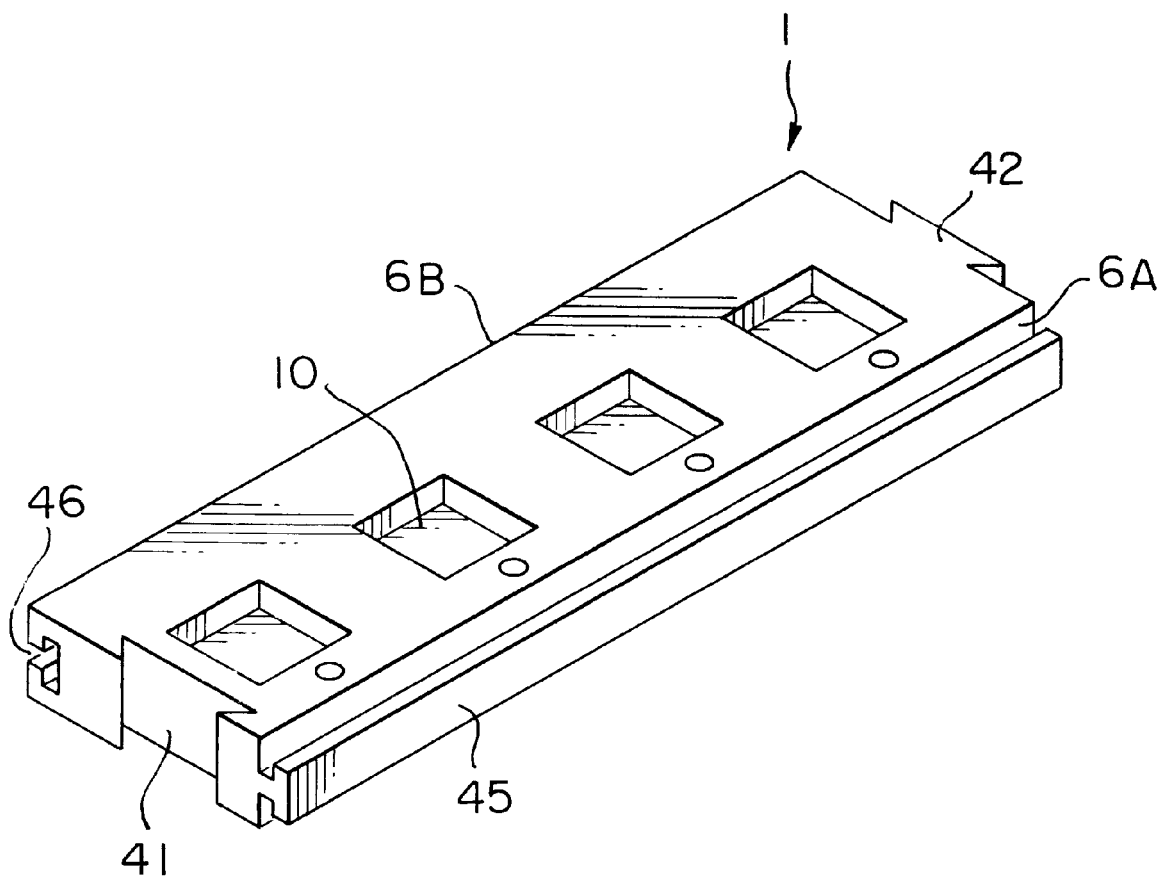
F I G. 14

TRAY FOR CONTAINING PARTS FOR STORAGE AND TRANSPORTATION

BACKGROUND OF THE INVENTION

1. Field of the Invention

The present invention relates to a tray for containing parts for storage and transportation. More particularly, the present invention relates to a tray for containing parts, such as IC chips, for storage and transportation and being conveniently serviceable for automatically mounting parts on a wiring board or the like.

2. Description of the Related Art

Referring to FIG. 15 showing a conventional tray 100 by way of example, the tray 100 is provided in its upper surface with a plurality of pockets 101 for containing electronic parts, arranged in rows and columns, and a plurality of positioning holes 102 in a predetermined positional relation with the pockets 101.

Referring to FIG. 16 showing a conventional electronic part mounting system in a schematic view, a mounting unit A mounts electronic parts on a wiring board or the like to be incorporated into an electronic apparatus. A handling unit B is installed on the receiving side of the mounting unit A. A plurality of trays containing electronic parts are stacked in a region E in the handling unit B. A handling device provided with a handling head C is installed in the handling unit B. In FIG. 16, components of the handling device other than the handling head C are not shown. The handling head is able to move in the directions of the arrow X and the arrow Y along an X-axis guide rail and a Y-axis guide rail.

The handling device detects the positioning hole 102 of the tray 100 by a sensor, not shown, moves the handling head C to a position indicated by XY coordinates based on position information provided by the sensor, and then moves the handling head C in a Z-axis direction, i.e., a direction perpendicular to the paper, to pick up the electronic part by suction from the tray 100. Then, the handling head C of the handling device holding the electronic part carries to a position under a positioning table F. Then, the positioning table F transfers the electronic part to the mounting unit A. After all the electronic parts contained in the tray 100 have been taken out, the empty tray 100 is transferred by an empty tray returning device, not shown, to an empty tray storage unit D disposed on the tray returning side of the handling unit B.

The handling unit B of this conventional electronic part mounting system must move the handling head C in the three directions, i.e., the X-axis direction, the Y-axis direction and the Z-axis direction. Since operations for moving the handling head C in the three directions cannot be synchronously carried out, the electronic part handling operation cannot be satisfactorily efficiently achieved. The rigidity of the guide rails must be enhanced to improve positioning accuracy in positioning the handling head C, which involves increase in the dimensions and weight, and structural complication of the guide rails and a driving mechanism for driving the guide rails, and, consequently, increases the cost of the electronic part mounting system. Furthermore, the electronic part mounting work must be interrupted during an empty tray returning operation, which reduces the efficiency of the electronic part mounting work.

As shown in FIG. 15, the conventional tray 100 is formed so as to contain a plurality of electronic parts (usually about twenty electronic parts). Therefore, the tray 100 not fully loaded is shipped to a customer when providing the customer with a few sample electronic parts less than the capacity of the tray 100, which needs distribution cost more then is necessary.

SUMMARY OF THE INVENTION

The present invention has been made to solve the above problems in the prior art and it is therefore a first object of the present invention to provide a tray capable of being handled by a part mounting system of a simple construction and of enabling highly efficient part mounting work.

A second object of the present invention is to provide a tray of a sectional type capable of being constructed by combining a necessary number of unit trays equal to the number of parts to be contained in the tray and of reducing distribution cost.

A third object of the present invention is to provide a part mounting system and a part mounting method suitable for using the tray in accordance with the present invention.

According to a first aspect of the present invention, a tray for containing parts for storage and transportation comprises a substantially rectangular tray body having an upper surface, a pair of first side surfaces extending in a longitudinal direction, and a pair of second side surfaces perpendicular to the first side surfaces. A plurality of pockets for containing parts are formed in the upper surface in regular, longitudinal arrangement at a predetermined pitch in a single row.

Preferably, the first side surfaces are provided with a plurality of teeth regularly and longitudinally arranged at a predetermined pitch so as to define grooves between the adjacent teeth, respectively. Each of the tooth and each of the grooves are complementary to each other. Two trays can be joined together by combining the teeth and the grooves of one of the two trays with the grooves and the teeth of the other tray, respectively. It is advantageous to shift the teeth on one of the first side surfaces of the tray body longitudinally by a distance equal to half the pitch of the teeth relative to the teeth on the other first side surface.

Preferably, each of the teeth has a first tooth flank on one side thereof and a second tooth flank on the other side thereof, and steps formed on the first tooth flank of each of the teeth on one of the pair of first side surfaces and those formed on the second tooth flank of each of the teeth on the other first side surface are complementary to each other. When the two trays are joined together transversely, the complementary steps formed on the mating tooth flanks of the teeth restrain the trays from vertical movement relative to each other.

Preferably, each of the teeth has a first tooth flank on one side thereof and a second tooth flank on the other side thereof, and recesses are formed in the first tooth flank of each of the teeth on one of the pair of first side surfaces and the second tooth flank of each of the teeth on the other first side surface, respectively, so that the recesses form positioning holes in a predetermined positional relation with the pockets when the two trays are joined together transversely. It is also preferable that each positioning hole is located at the middle point on a segment line connecting the respective centers of the two transversely adjacent pockets when the two trays are joined together transversely.

Positioning holes formed in the teeth in a predetermined positional relation with the pockets may be used for positioning instead of the foregoing positioning holes formed by the two mating recesses.

It is advantageous to form a recess in one of the second side surfaces of the tray body and to form a projection complementary to the recess formed in one of the second side surfaces in the other second side surface to enable the trays to be longitudinally joined together by fitting the projection of one of the trays in the recess of another tray adjacent to the former. It is preferable to determine the shape and dimensions of the tray body so that, when the plurality of trays are joined together longitudinally, the center distance between the pocket at one end of one of the trays and the pocket at one end of another tray adjacent to the former is equal to the pitch of the pockets on each tray. The shape and dimensions of the tray body is determined so that, when the plurality of trays are joined together longitudinally, the center distance between the tooth at one end of one of the tray and the tooth at one end of another tray adjacent to the former is equal to the pitch of the tooth on each tray.

Joining means other than the above-mentioned joining means for longitudinally and/or transversely joining together the plurality of trays may be employed.

According to a second aspect of the present invention, a part carrying apparatus for carrying a substantially rectangular tray provided with a plurality of pockets for containing parts in a longitudinal arrangement and for handling the parts contained in the pockets comprises a tray holding device for holding the tray, a driving mechanism for longitudinally moving the tray holding device, and a part transfer device for taking out the part from the pocket of the tray located at a predetermined position.

According to a third aspect of the present invention, a method of carrying a substantially rectangular tray provided with a plurality of pockets for containing parts in a longitudinal arrangement and handling the parts contained in the pockets comprises steps of holding the tray by a tray holding device, longitudinally moving the tray holding device to move a predetermined pocket of the tray to a predetermined position, and taking out the part from the pocket moved to the predetermined position.

BRIEF DESCRIPTION OF THE DRAWINGS

The above and other objects, features and advantages of the present invention will become more apparent from the following description taken in connection with the accompanying drawings, in which:

FIG. 4 is a fragmentary plan view of a tray assembly formed by longitudinally and transversely joining together a plurality of trays analogous with that shown in FIG. 1;

FIGS. 7A and 7B are plan views of possible positioning holes;

FIG. 8 is a plan view of a positioning hole formed in a tooth;

FIGS. 9A and 9B are plan views of possible teeth;

FIG. 11 is a QFP as a typical example of part to be contained in a tray;

FIGS. 13A and 13B are diagrammatic views of assistance in explaining the operation of the mounting apparatus of FIG. 12;

FIG. 14 is a perspective view in another embodiment according to the present invention;

DESCRIPTION OF THE PREFERRED EMBODIMENTS

Preferred embodiments of the present invention will be described hereinafter with reference to the accompanying drawings.

Figure 1:
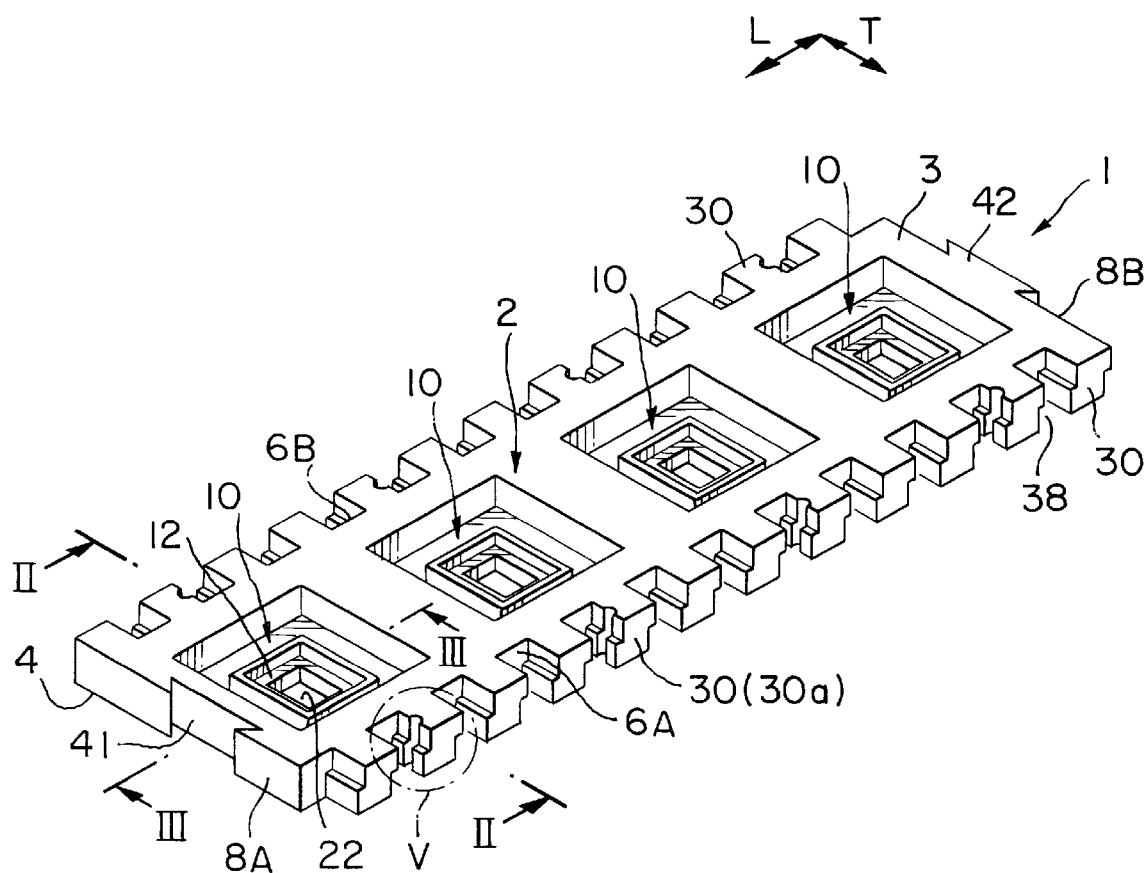
FIG. 1 is a perspective e view of a tray in a preferred embodiment according to the present invention.

Referring to FIG. 1, a tray 1 has the shape of a generally rectangular, thin block. Most typical example of parts to be contained in the tray 1 are surface-mount QFPs (quad flat packages) having external leads arranged on the four sides thereof. As shown in FIG. 11, the QFP, i.e., an electronic part 50, has a molded portion 51 and a lead portion 53. The tray d1 is made of a material having a surface resistivity on the order of $10^5$ to $10^{12}$ $\Omega/\square$, such as a material prepared by mixing a polystyrene resin and carbon powder.

The tray 1 has a tray body 2 having an upper surface 3, a lower surface 4, a pair of parallel first side surfaces 6A and 6B extending in a longitudinal direction L, a pair of second side surfaces 8A and 8B extending in a transverse direction T perpendicular to the longitudinal direction L.

A plurality of pockets 10 for containing electronic parts 50 are formed in a single row in the upper surface 3 of the tray body 2 in a regular longitudinal arrangement at a predetermined pitch p1 (FIG. 4). Although the tray 1 shown in FIG. 1 is provided with the four pockets 10 for simplicity, the number of the pockets 10 need not be limited to four.

Figure 2:
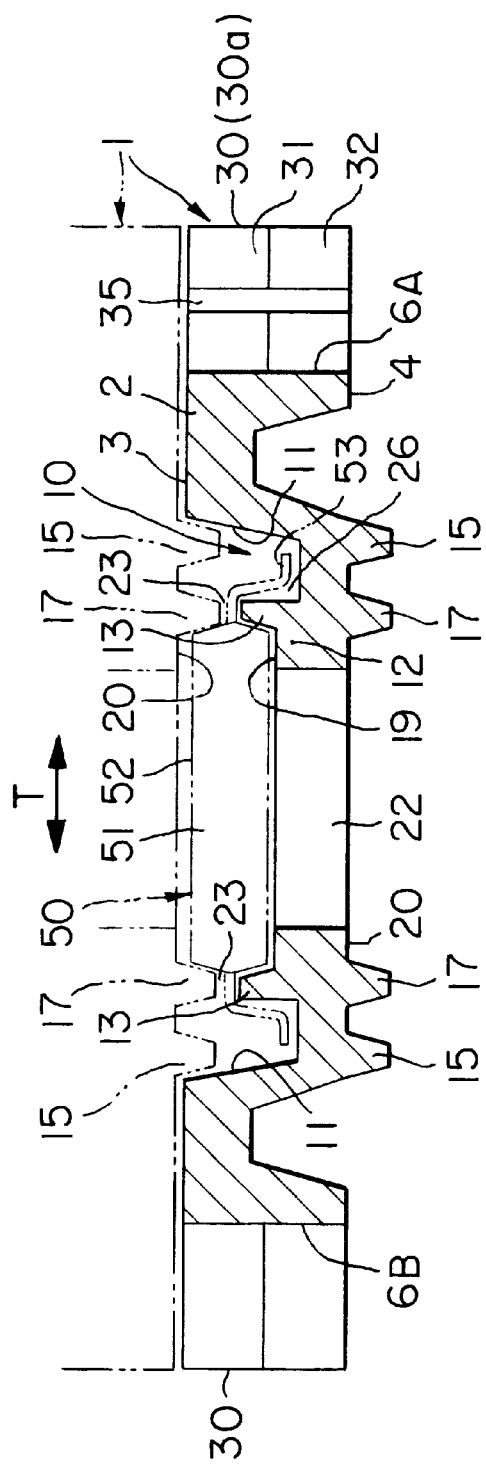
FIG. 2 is cross-sectional view of the tray of FIG. 1.
Figure 3:
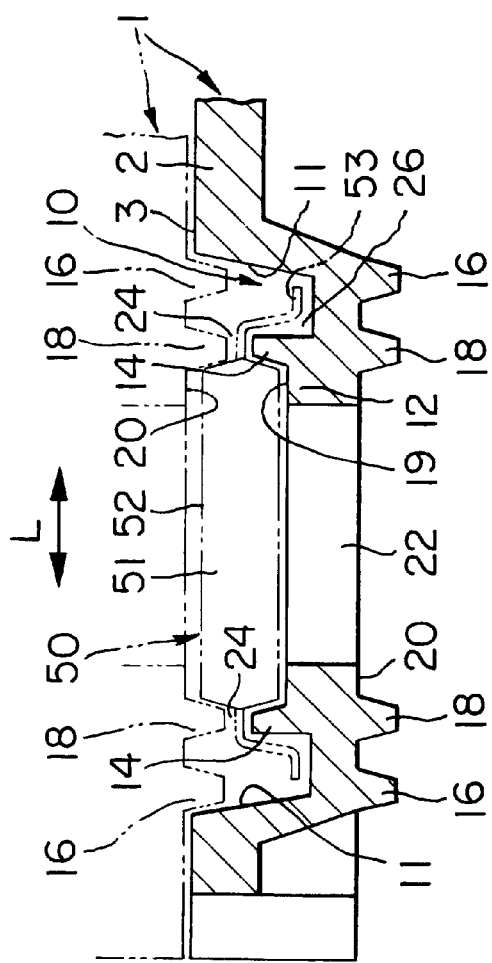
FIG. 3 is a longitudinal sectional view of the tray of FIG. 1.

FIGS. 2 and 3 show two trays 1 containing electronic parts 50 indicated by alternate long and two short dashes lines and stacked on top or the other. In FIGS. 2 and 3, the tray 1 on top of the other is indicated by alternate long and two short dashes lines. A seat 12 on which the molding portion 51 of the electronic part (QFP ) 50 is seated is formed in a central portion of the bottom of the pocket 10. The seat 12 is slightly larger than the molded portion 51. A pair of positioning projections 13 and a pair of positioning projections 14 for positioning the molded portion 51 on the seat 12 are formed in the periphery of the seat 12. The positioning projections 13 and the positioning projections 14 extend in the longitudinal direction L and the transverse direction T, respectively, to position the molded portion 51 of the electronic part 50 with respect to the transverse direction T and the longitudinal direction L.

A pair of longitudinal ridges 15 parallel to the longitudinal direction L and a pair of transverse ridges 16 parallel to the transverse direction T are formed on the lower surface 4 of the tray body 2. When the trays 1 are stacked one on top of another, the ridges 15 and 16 of the overlying tray 1 come into contact with the side walls 11 defining the pockets 10 of the underlying tray 1 to position the stacked trays 1 relative to each other with respect to the transverse direction T and the longitudinal direction L.

A pair of longitudinal ridges 17 parallel to the longitudinal direction L and a pair of transverse ridges 18 parallel to the transverse direction T are formed on the lower surface 4 of the trays body 2. When the trays 1 containing electronic parts 50 in their pockets 10 are stacked one on top of another, the ridges 17 and 18 of the overlying tray 1 come very close to the molded portion 51 of the electronic part 50 contained in the pocket 10 of the underlying tray 1 to position the molded portion 51 of the electronic part 50 with respect to the transverse direction T and the longitudinal direction L in cooperation with the projections 13 and 14.

The molded portion 51 of the electronic part 50 contained in the pocket 10 is restrained from vertical movement by the upper surface of the seat 12 provided with the projections 13 and 14, and a stopper section 20 of the lower surface 4 surrounded by the projections 17 and 18.

An opening 22 is formed in a central portion of the seat 12 on which the electronic part 50 is seated to enable the observation of matters marked on the upper surface of the molded portion 51 of the electronic part 50 for the confirmation of the type of the electronic part 50 when the trays 1 containing the electronic parts 50 are stacked.

When the trays 1 containing the electronic parts 50 are stacked, spaces 23 and 24 are formed between the respective extremities of the projections 13 and 17 and between the respective extremities of the projections 14 and 18, respectively. Spaces 26 are formed between the projections 13 and 14 and the side walls 11 defining the pocket 10, respectively. The shapes and dimensions of the spaces 23, 24 and 26 are determined so that the leads 53 of the electronic parts 50 contained in the trays 1 may not touch any portions of the trays 1 when the trays 1 are stacked.

As shown in FIG. 1, teeth 30 of a shape substantially resembling a rectangular prism are formed on the entire first side surfaces 6A and 6B. As shown in FIG. 4, the teeth 30 are arranged longitudinally at regular intervals at a predetermined pitch p2. A predetermined number (three, in this embodiment) of the teeth 30 on each of the first side surfaces 6A and 6B correspond to each pocket 10. All the pockets 10 are the same in positional relation with the corresponding teeth 30, respectively. The pitch p1 between the pockets 10 is an integral multiple of the pitch p2 between the teeth 30. In this embodiment, the pitch p1 is three times the pitch p2.

All the teeth 30 have the same shape. The teeth 30 are substantially the same in shape as grooves 38 having a shape resembling a rectangular prism and formed between the teeth 30. In other words, the teeth 30 and grooves 38 are complementary each other. The width of the teeth 30, i.e., the size of the teeth 30 measured in the longitudinal direction L, and the width of the grooves 38, i.e., the size of the grooves 38 measured in the longitudinal direction L, are substantially equal to half the pitch p2 of the teeth 30. However, it need hardly be said that the width of the groove 38 is slightly greater than that of the teeth 30 so that the teeth 30 can be fitted in the grooves 38, respectively.

As shown in FIG. 4, the teeth 30 on the first side surface 6B are shifted longitudinally by half the pitch p2 between the teeth 30 relative to those formed on the first side surface 6A. Since the teeth 30 on the first side surface 6A and the teeth 30 on the first side surface 6B are thus staggered, the pockets 10 of the trays 1 are arranged on transverse straight lines when the trays 1 are joined together in the transverse direction T, and the second side surfaces 8A and 8B of the trays 1 are aligned respectively.

Figure 5:
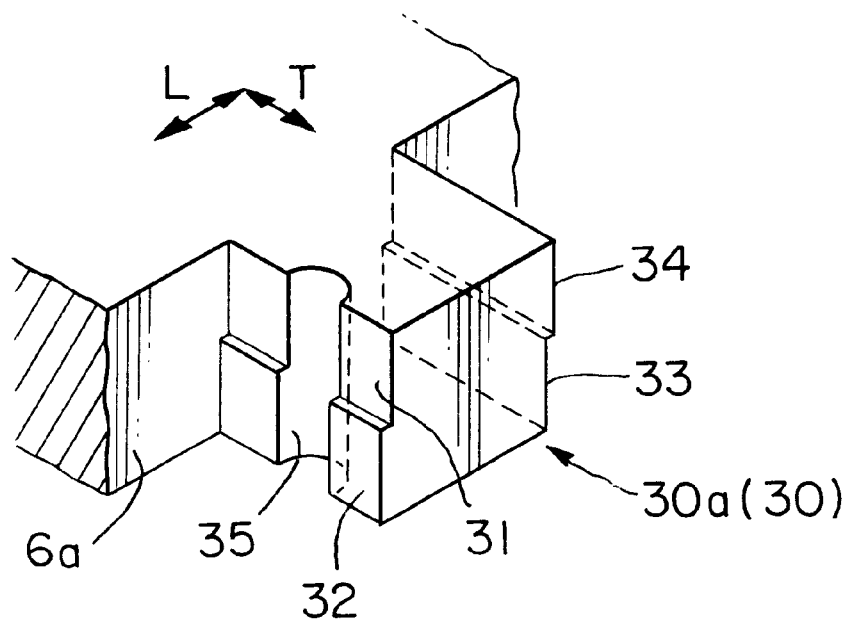
FIG. 5 is an enlarged perspective view of a portion indicated at V in FIG. 1, showing the shape of a tooth in detail.
Figure 6:
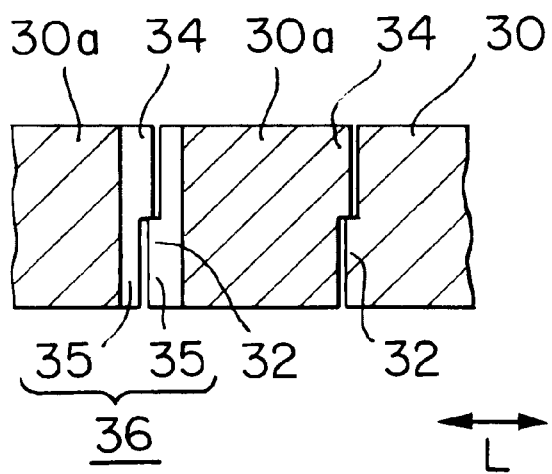
FIG. 6 is a sectional view of engaged teeth in a state where trays are joined together transversely.

Referring to FIGS. 5 and 6, each of the teeth 30 has a pair of tooth flanks 31 and 33, i.e., opposite surfaces with respect to the longitudinal direction L. The tooth flank 31 on the side of the second side surface 8A has a lower raised section 32. The other tooth flank 33 on the side of the second side surface 8B has an upper raised section 34. The raised sections 32 and 34 have the same shape and the same dimensions. In other words, a step is formed on each of tooth flanks 31, 33, and the step of each tooth flank 31 and that of each flank 33 are complementary to each other. When the trays 1 are joined together in the transverse direction T as shown in FIG. 4 by engaging the teeth 30 on the first side surface 6A of the tray 1 and the teeth 30 on the first side surface 6B of the tray 1 adjacent to the former as shown in FIG. 6, the raised sections 32 and 34 of the tooth flanks 31 and 33 of the adjacent teeth 30 are engaged to restrain the joined trays 1 from vertical movement relative to each other.

In this embodiment, all of the tooth flanks have the raised sections (see FIG. 1 ), however, some specific tooth flanks among the tooth flanks may have the raised sections.

The shapes of the tooth flanks of the teeth 30 need not be limited to those shown in FIGS. 5 and 6, provided that the shape of the tooth flank on the side of the second side surface 8A and the tooth flank on the side of the second side surface 8B are complementary to each other and are capable of restraining the joined trays 1 from vertical movement relative to each other.

A semicylindrical recess 35 is formed in the tooth flank 31 or the tooth flank 33 of specified teeth 30 among the plurality of teeth 30. In the following description, the teeth 30 provided with the recess 35 will be designated by 30a when necessary.

The tooth 30a on the first side surface 6A is provided with the semicylindrical recess 35 in the tooth flank 31 on the side of the second side surface 8A, and the tooth 30a on the first side surface 6B is provided with the semicylindrical recess 35 in the tooth flank 33 on the side of the second side surface 8B.

As shown in FIG. 4, the tooth flanks 31 and 33 of the teeth 30a provided with the recesses 35, respectively, are or a transverse straight line parallel to the transverse direction T and passing the respective centers C of the pockets 10. Therefore, when the trays 1 are joined together transversely, the recesses 35 of the mating tooth flanks 31 and 33 are put together to form cylindrical holes 36. As shown in FIG. 4, the center of each of the holes 36 is at the middle point on a line segment connecting the respective centers C of the transversely adjacent pockets 10 of the transversely adjacent trays 1, and is at the same position as the centers C of the pockets 10 with respect to the longitudinal direction L. The holes 36 can be conveniently used as positioning holes for detecting the pocket positions of the assembly of the trays 1, as will be described later.

The shape of the hole 36 formed when the tooth 30a are engaged need not be limited to the cylindrical shape, the hole 36 may be holes having the shape of a quadrangular prism having a square cross section as shown in FIG. 7A, a rectangular cross section as shown in FIG. 7B or a rhombic cross section.

In this embodiment, each hole 36 is formed between the two contiguous teeth 30a. However, the hole 36 may be formed in a substantially central portion of the tooth 30a as shown in FIG. 8. When the hole 36 is formed in a substantially central portion of the tooth 30a as shown in FIG. 8, it is desirable that the center of the hole 36 be at the middle point connecting the respective centers C of the transversely adjacent pockets 10 of the transversely adjacent trays 1. The hole 36 shown in FIG. 8 also can be used for positioning.

Although the teeth 30 of the tray 1 in this embodiment are rectangular as viewed from above the upper surface 3, teeth of a shape other than that of the teeth 30 may be used. For example, teeth having the shape of a trapezoidal prism as shown in FIG. 9A or a triangular prism as shown in FIG. 9B may be used. It Is also preferable with the teeth of the shape other than that of the teeth 30 employed in this embodiment that the positional relation between the positioning hole 36 and the pockets 10 is the same as that previously described with reference to FIG. 4. It is preferable that the mating tooth flanks are provided a raised section and a recessed section complementary to the raised section, respectively.

A flaring mortise 41 (recess) is formed in the second side surface 8A and a flaring tenon 42 (projection) capable of being fitted in the flaring mortise 41 is formed in the second side surface 8B. Two trays 1 can be longitudinally joined together as shown in FIG. 4 by fitting the flaring tenon 42 of one of the trays 1 in the flaring mortise 41 of the other tray 1. The flaring mortise 41 and the flaring tenon 42 are engaged to restrain the joined trays 1 from longitudinal movement relative to each other. Although the mortise 41 and the tenon 42 in this embodiment are trapezoidal as viewed from above the upper surface 3, a mortise and a tenon of shapes other than those of the mortise 41 and the tenon 42 may be used.

As shown in FIG. 4, the distance between the second side surface 8B and the center c of the pocket 10 nearest to the second side surface 8B, and the distance between the second side surface 8A and the center C of the pocket 10 nearest to the second side surface 8A are equal to half the pitch p1 between the pockets 10. Therefore, the distance between the center C of the pocket 10 nearest to the second side surface 8B and the center C of the pocket 10 nearest to the second side surface 8A when trays 1 are joined longitudinally is equal to the pitch p1 between the pockets 10. Therefore, when the trays 1 are connected longitudinally in parallel to the longitudinal direction L, all the pockets 10 of those trays 1 are arranged regularly and longitudinally at the pitch p1. Means for longitudinally arranging the pockets 10 of the trays 1 at the pitch p1 need not be limited to the foregoing means.

As shown in FIG. 4, the tooth flank 33 of the tooth 30 nearest to the second side surface 8B among those formed on the first side surface 6A In flush with the second side surface 8B. The tooth flank 31 of the tooth 30 nearest to the second side surface 8A among those formed on the first side surface 6B is flush with the second side surface 8A. Therefore, when the trays 1 are joined together in a longitudinal arrangement, the teeth 30 of all the trays 1 are arranged longitudinally at the pitch p2.

A method of using the tray 1 thus formed will be described hereinafter.

[Packaging Electronic Parts]

Figure 10:
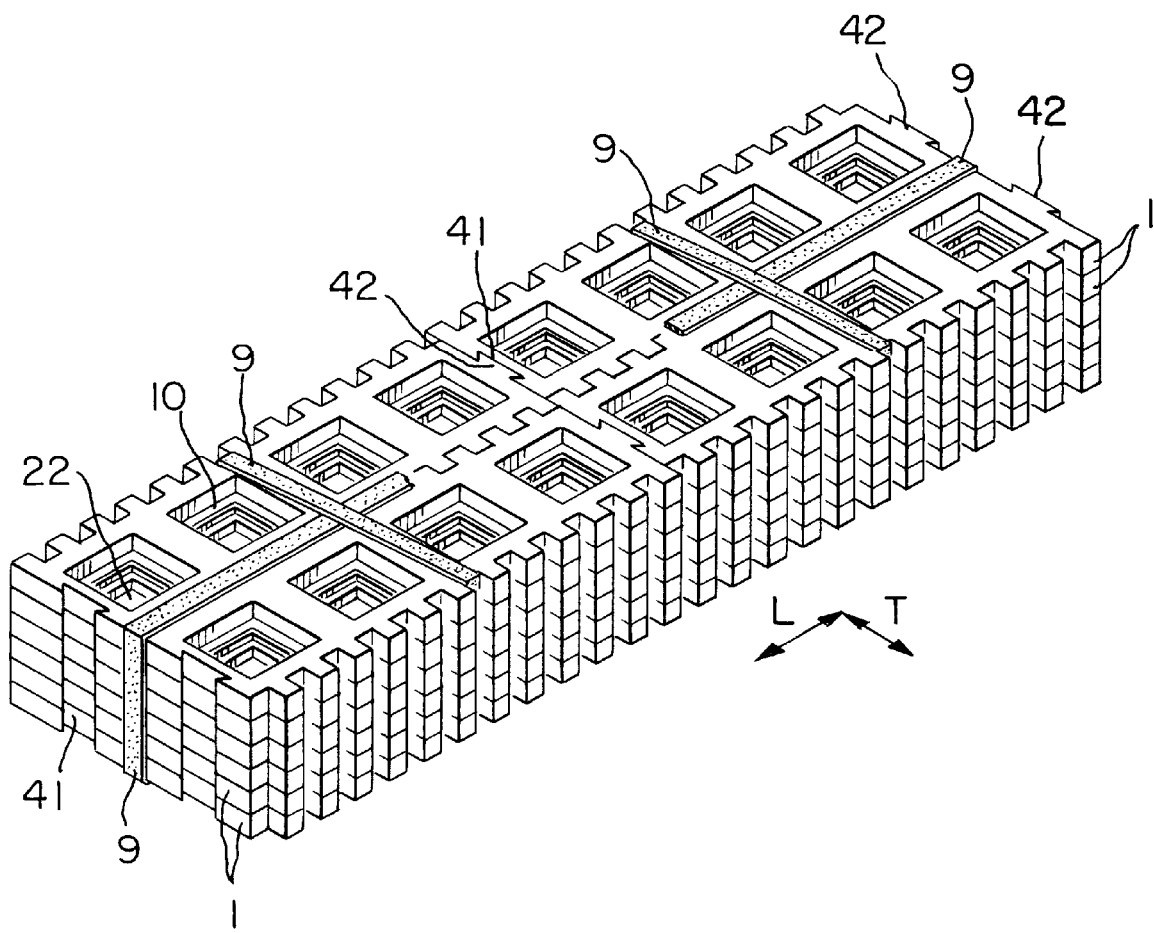
FIG. 10 is a perspective view of a stack of tray assemblies each formed by joining together a plurality of trays.

FIG. 10 shows a package of trays 1 containing electronic parts in their pockets 10. A plurality of trays 1 are connected longitudinally and transversely (two trays 1 in a longitudinal arrangement and two trays 1 in a transverse arrangement in this example) to form a tray assembly. A plurality of tray assemblies (six tray assemblies in the example) are stacked vertically. Preferably, the stack of the tray assemblies are fastened together by bands 9. The trays 1 are connected in a plane and stacked vertically in the manners previously described with reference to FIGS. 2 to 4.

The top tray 1 does not contain any electronic parts and serves as a holding means for holding the electronic parts in place in the pockets 10 of the second top tray 1. As mentioned above, the trays 1 are provided with the openings 22 and hence matters marked on the electronic parts 50 can be observed for the confirmation of the type of the electronic parts 50. Since any number of trays 1 can be connected longitudinally and transversely in a plane to form a tray assembly of a desired capacity, and a desired number of tray assemblies can be stacked vertically, the electronic parts 50 of a desired lot size can be packaged. The tray assemblies can be formed in a desired shape.

[Mounting Electronic Parts]

A method of transferring the electronic parts 50 contained in the trays 1 from the tray 1 to an electronic part mounting system will be described with reference to FIGS. 12, 13A and 13B. First, an electronic part carrying apparatus will be described with reference to FIG. 12.

Figure 12:
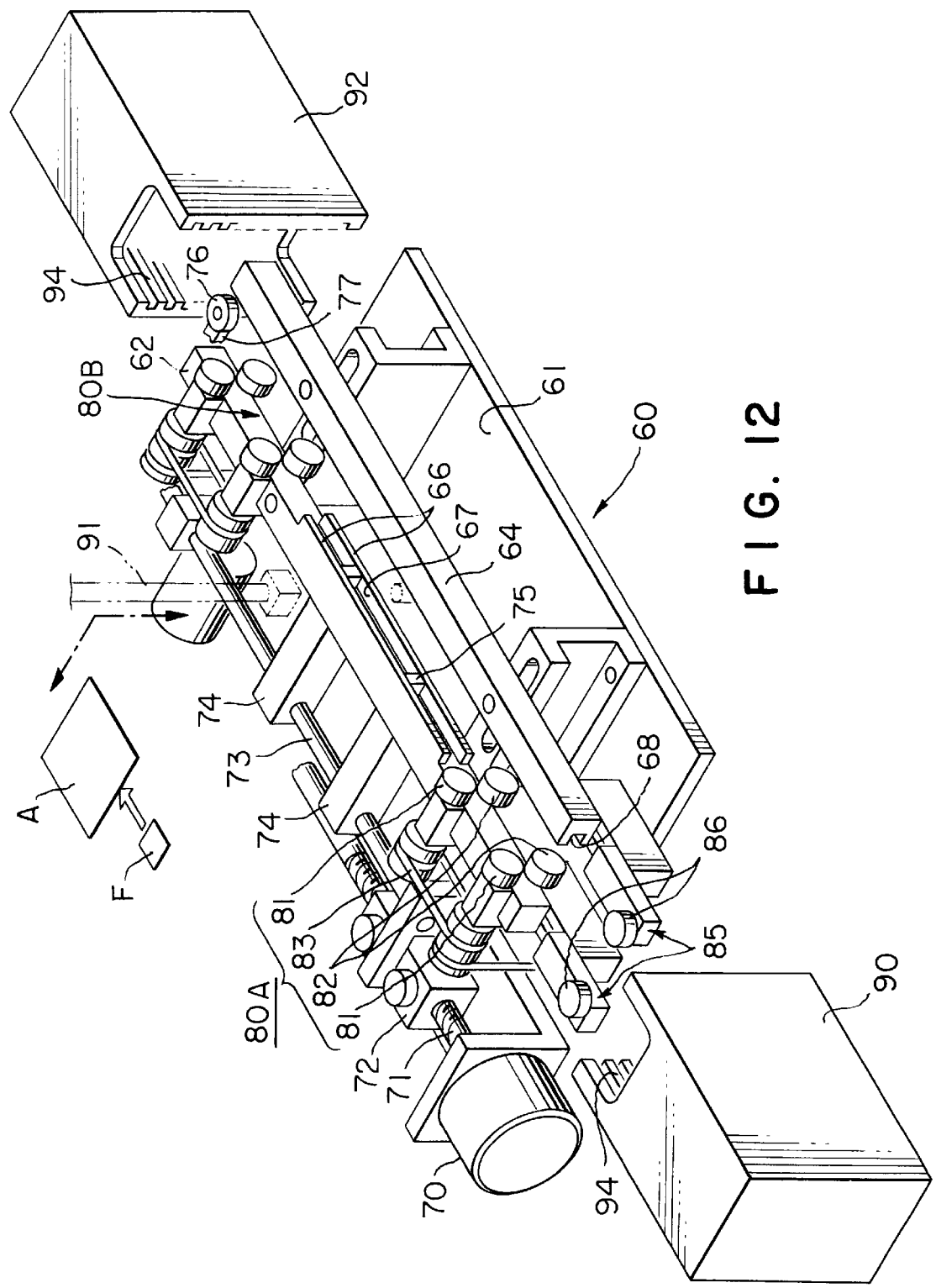
FIG. 12 is a perspective view of a device mounting system suitable for use in combination with trays in accordance with the present invention.
Figure 15:
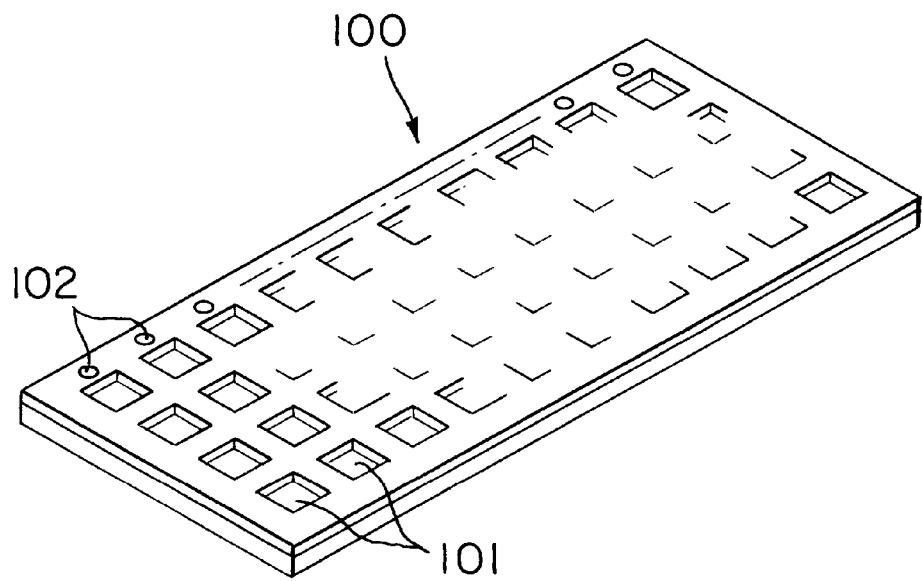
FIG. 15 is a perspective view of a conventional tray.
Figure 16:
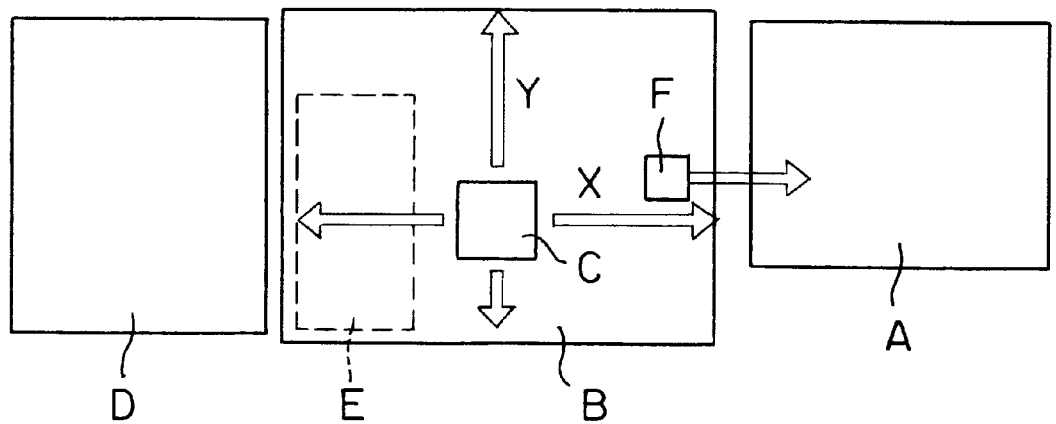
FIG. 16 is a diagrammatic view of a conventional semiconductor device mounting system.

Referring to FIG. 12, there are shown a loader magazine 90 storing a plurality of trays 1 loaded with electronic parts 50, an electronic part mounting system A for mounting electronic parts on wiring boards, a handling head 91 included in a part handler for taking out the electronic parts 50 from the pockets 10 of the trays 1, and an unloader magazine 92 for containing empty trays 1.

A tray carrier unit 60 takes out the loaded tray 1 from the loader magazine 90, carries the loaded tray 1, locates the loaded tray 1 directly below the handling head 91, and carries an empty tray 1 to the unloader magazine 92.

The loader magazine 90 and the unloader magazine 92 are internally provided with a plurality of support rails 94. The trays 1 are supported on the support rails 94 in a vertical arrangement at predetermined vertical intervals in the loader magazine 90 and the unloader magazine 92. The loader magazine 90 and the unloader magazine 92 are moved vertically by lifting mechanisms (not shown).

The tray carrier unit 60 has a pair of parallel guide rails 62 and 64. The guide rail 62 is fixedly supported on a base 61. The other guide rail 64 can be moved toward and away from the guide rail 62 to adjust the interval between the pair of guide rails 62 and 64. A pair of longitudinal guide ridges 66 are formed on the inner side surface of the guide rail 62 facing the guide rail 64. The pair of guide ridges 66 define a guide groove 67 of a width slightly greater than the thickness of the trays 1. A guide groove 68 of a width slightly greater than the thickness of the trays 1 is formed in the inner side surface of the guide rail 64 facing the guide rail 62. The guide grooves 67 and 68 are parallel to each other. A longitudinal slit is formed in the bottom surface of the guide groove 67 of the guide rail 62.

The tray carrier unit 60 has a linear driving mechanism (direct acting mechanism) comprising a stepping motor 70, a feed screw shaft 71 driven for rotation by the stepping motor 70, and a feed nut 72 in screw-engagement with the feed screw shaft 71. A rod 73 is fixedly supported on the feed nut 72. A pair of chucks 74 are fixed at a predetermined interval to the rod 73. Each chuck 74 is provided at its extremity with a pin 75 capable of being closely fitted in the groove 38 between the teeth 30 on the first side surface 6A (or 6B) of the tray 1. The pins 75 are inserted in the slit of the guide rail 62 and are capable of being advanced toward and retracted away from the tray 1 moving through the space between the guide rails 62 and 64. The pins 75 can be moved longitudinally along the slit by the linear driving mechanism. An L-shaped support plate 77 supporting a push pin 76 for pushing the empty tray 1 into the unloader magazine 92 is supported on one end of the rod 73 on the side of the unloader magazine 92.

A feed roller unit 80A for feeding the tray 1 to a position where the pins 75 of the chucks 74 engage the tray 1 is disposed an the front end portions, i.e., end portions on the side of the loader magazine 90, of the guide rails 62 and 64. A delivery roller unit 80B for receiving the tray 1 from the chucks 74 and delivering the same to the unloader magazine 92 is disposed on the back end portion, i.e., end portions on the side of the unloader magazine 92, of the guide rails 62 and 64. The feed roller unit 80A has two drive rollers 81 and two driven rollers 82 respectively corresponding to the drive rollers 81. The tray 1 passes the nips between the drive rollers 81 and the corresponding driven rollers 82. The drive rollers 81 are driven for rotation through a belt 83 by a servomotor, not shown. The delivery roller unit 80B is substantially the same in construction as the feed roller unit 80A.

A transfer roller unit 85 for taking out the tray 1 from the loader magazine 90 and transferring the same to the feed roller unit 80A is disposed between the feed roller unit 80A and the loader magazine 90. The transfer roller unit 85 has a pair of transfer rollers 86 spaced a distance substantially equal to the width, i.e., the size in the transverse direction T, of the trays 1 apart. The transfer rollers 86 can be longitudinally moved in parallel to the guide rails 62 and 64.

The handling head 91 is disposed above a middle portions of the guide rails 62 and 64. A sensor 94 for detecting the tray is disposed directly below the handling head 91.

Description will be given of operations of the electronic part carrying apparatus for carrying the loaded tray 1 from the loader magazine 90 to a transfer position where the electronic parts 50 contained in the tray 1 are transferred sequentially to the electronic part mounting system A, and carrying the empty tray 1 to the unloader magazine 92.

The transfer rollers 86 of the transfer roller unit 85 are advanced toward the loader magazine 90 so as to hold the tray 1 therebetween, the transfer rollers 86 are driven for rotation to transfer the tray 1 to the feed roller unit 80A as indicated by alternate long and two short dashes lines in a left-hand section of FIG. 13A.

The feed roller unit 80A feeds the tray 1 so that the tray 1 is inserted in the guide grooves 67 and 68. Upon the detection of the leading edge of the tray 1 by the sensor 94, the feed roller unit 80A is stopped. Subsequently, the pins 75 of the chucks 74 are advanced toward the tray 1 so as to be fitted in the grooves 38 formed at predetermined positions in the first side surface of the tray 1 as shown in a middle section of FIG. 13A. Since the tray 1 is thus stopped at a predetermined position and the chucks 74 hold the tray 1 at a predetermined position, the pins 75 of the chucks 74 are fitted always in the grooves 38 at the same positions relative to the leading edge of the tray 1.

The chucks 74 holding the tray 1 is driven for linear movement toward the back side of the electronic part carrying apparatus, i.e., to the right as viewed in FIG. 13A, by the linear driving mechanism including the stepping motor 70. The chucks 74 are stopped intermittently so as to locate the pockets 10 of the tray 10 sequentially at a transfer position directly below the handling head 91 of the part handler. The handling head 91 transfers the electronic parts 50 contained in the pockets 10 of the tray 1 sequentially from the tray 1 to a positioning table F schematically shown in FIG. 12. The positioning table F transports the electronic part 50 to the electronic part mounting system A schematically shown in FIG. 12, and then the electronic part mounting system A mounts the electronic part 50 on a wiring board. The positioning table F and the electronic part mounting system A are conventional well-known ones.

As mentioned above, the grooves 38 and the pockets 10 of the tray 1 are in a predetermined positional relation, and the pins 75 of the chucks 74 come into engagement always with the specific grooves 38 in a predetermined positional relation with the leading edge of the tray 1. Therefore, once the pins 75 of the chucks 74 are brought once into engagement with the specific grooves 38 of the tray 1, the positions of the electronic parts 50 and the pockets 10 needs not be examined every time the chucks 74 are moved, and the pockets 10 can be sequentially and accurately positioned at the transfer position directly below the handling head 91 simply by feeding the chucks 74 by a predetermined distance at a time.

After the last electronic part 50 among those contained in the tray 1 has been taken out by the handling head 91 as illustrated in a middle section in FIG. 13B, the chucks 74 carries the empty tray 1 to a position where the rollers of the delivery roller unit 80B are able to nip the empty tray 1 therebetween, and the pins 75 are disengaged and retracted from the tray 1 to release the empty tray 1. Then, the delivery roller unit 80B inserts the empty tray 1 half into the unloader magazine 92 as illustrate in a right-hand section in FIG. 13A. The empty tray 1 half inserted in the unloader magazine 92 is fully pushed into the unloader magazine 92 as illustrate in a right-hand section in FIG. 13B by the push pin 76 interlocked with the chucks 74 as the chucks 74 holding the next loaded tray 1 moves toward the delivery roller unit 80B, After all the electronic parts 50 have been transferred to the electronic part mounting system A and the tray 1 has become empty, the loader magazine 90 is raised so that the next loaded tray 1 is moved to a position where the transfer roller unit 85 is able to take out the next loaded tray 1 from the loader magazine 90. Subsequently, the electronic part carrying apparatus repeats the foregoing operations for the next tray 1.

As is apparent from the foregoing description, the handling head 91 may be such as capable of carrying out simple motions when the tray 1 of the present invention is employed; that is, the handling head 91 needs to be merely capable of vertical movement between the predetermined transfer position between the guide rails 62 and 64 and an upper position directly above the transfer position and of horizontal movement between the upper position directly above the transfer position and a position corresponding to the positioning table F. Thus, the part handler may be of a simple mechanism. The operations for taking out the loaded tray 1 from the loader magazine 90 and for inserting the empty tray 1 into the unloader magazine 92 can be carried out independently of the operations for transferring the electronic part 50 from the tray 1 to the electronic part mounting system A, the electronic part mounting system A is able to carry out a rapid electronic part mounting operation.

Although the trays 1 of the present invention can be most efficiently handled by the electronic part carrying apparatus designed specially for handling the trays 1 of the present invention., the trays 1 of the present invention can be handled also by a conventional automatic electronic part mounting system which handles trays each provided with a plurality of pockets arranged in rows and columns. If such a conventional automatic electronic part mounting system is used for handling the trays 1 of the present invention, the trays 1 are combined longitudinally and transversely in a tray assembly as shown in FIG. 4. Since the positioning holes 36 are formed each at the middle point of the line segment connecting the centers C of the transversely adjacent pockets 10 in the tray assembly and the positioning holes 36 are in a specific positional relation with the pockets 10 of the trays 1, the positions of the pockets 10 of the trays 1 on the automatic electronic part mounting system can be easily detected through the detection of the positioning holes 36.

The teeth 30 and the grooves 38 formed on the first side surfaces 6A and 6B of the tray 1 are used for holding the tray 1 by the chucks 74 of the electronic part carrying apparatus and for combining the trays 1 to form a tray assembly. If it is desired only to save distribution expenses by forming a tray assembly having the least necessary capacity for carrying a desired number of electronic parts by combining trays, each of the trays may be provided on the first side surfaces thereof with a projection and recesses complementary to the projection, respectively. FIG. 14 shows such a tray 1 in a preferred embodiment according to the present invention. As shown in FIG. 14, the tray 1 is provided on its first side surface 6A with a longitudinal ridge 45 having a section resembling the letter T instead of the teeth 30 and the grooves 38, and on its first side surface 6B with a longitudinal groove 46 complementary to the ridge 45 instead of the teeth 30 and the grooves 38. When joining together a plurality of trays 1 like that shown in FIG. 14 in a transverse arrangement, the longitudinal ridge 45 of one tray 1 is fitted in the longitudinal groove 46 of another tray 1 contiguous with the former.

Although the tray 1 of the present invention has been described as applied to containing the electronic parts, the tray 1 of the present invention need not be limited thereto in its practical application and may be used for containing small machine parts or the like.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A tray for containing parts for storage and transportation, comprising:

a substantially rectangular tray body having an upper surface, a pair of first side surfaces extending in a longitudinal direction of the tray body, a pair of second side surfaces perpendicular to the first side surfaces, and a plurality of pockets disposed in the upper surface of the tray body, the pockets being aligned only in one row along the longitudinal direction at a first predetermined pitch; and a plurality of teeth provided on both of the first side surfaces of the tray body so as to define a groove between the adjacent teeth, the teeth being aligned in a row along the longitudinal direction at a second predetermined pitch, each of the teeth and the grooves being complementary to each other such that two trays can be joined together in a transverse direction of the tray body by combining the teeth and the grooves of one of the two trays with the grooves and the teeth of the other of the two trays, the teeth on one of the first side surfaces being shifted by a distance equal to half the second pitch of the teeth relative to the teeth on the other of the first side surfaces with respect to the longitudinal direction, wherein a predetermined number of teeth on each of the first side surfaces correspond to each of the pockets, and each of the pockets is the same in positional relationship with the corresponding teeth.

2. A tray according to claim 1, wherein each of the teeth has a first flank on one side thereof and a second tooth flank on the other side thereof, wherein steps are formed on the first tooth flanks of the teeth on one of the pair of first side surfaces, wherein steps are formed on the second tooth flanks of the teeth on the other first side surface, wherein the steps on the first tooth flanks and those on the second tooth flanks are complementary to each other, and, wherein, when the two trays are joined together transversely, the steps formed on the mating tooth flanks of the teeth and complementary to each other restrain the trays from vertical movement relative to each other.

3. The tray according to claim 1, wherein each of the teeth has a first tooth flank on one side thereof and a second tooth flank on the other side thereof, recesses are formed in the first tooth flank of each of the teeth on one of the pair of first side surfaces and the second tooth flank of each of the teeth on the other first side surface, respectively, and the recesses form positioning holes in a predetermined positional relation with the pockets when the two trays are joined together transversely.

4. The tray according to claim 3, wherein each positioning hole is located at a middle point on a segment line connecting the respective centers of the two transversely adjacent pockets when the two trays are joined together transversely.

5. The tray according to claim 1, wherein positioning holes are formed in the teeth in a predetermined positional relation with the pockets.

6. The tray according to claim 1, wherein the teeth have a shape resembling a rectangular prism.

7. The tray according to claim 1, wherein a recess is formed in one of the second side surfaces of the tray body and a projection complementary to the recess is formed on the other second side surface to enable the trays to be longitudinally joined together by fitting the projection of one of the trays in the recess of another tray adjacent to the former.

8. The tray according to claim 7, wherein the shape and dimensions of the tray body are determined so that, when the plurality of trays are joined together longitudinally, the center distance between the pocket at one end of one of the trays and the pocket at one end of another tray adjacent to the former is equal to the pitch of the pockets on each tray.

9. The tray according to claim 7, wherein the shape and dimensions of the tray body are determined so that, when the plurality of trays are joined together longitudinally, the center distance between the tooth at one end of one of the tray and the tooth at one end of another tray adjacent to the former is equal to the pitch of the teeth on each tray.

10. The tray according to claim 1 further comprising a joining element joining two trays longitudinally and/or transversely.

11. A tray according to claim 1, wherein the first predetermined pitch of the pockets is an integral multiple of the second predetermined pitch of the teeth.

12. A tray according to claim 1, wherein the tray body is integrally formed.

13. A tray according to claim 1, wherein the parts are electronic parts.

14. A tray according to claim 1, wherein the parts are mechanical parts.

* * * * *